(12) United States Patent
Achuthan et al.

(10) Patent No.: US 6,989,563 B1
(45) Date of Patent: Jan. 24, 2006

(54) FLASH MEMORY CELL WITH UV PROTECTIVE LAYER

(75) Inventors: Krishnashree Achuthan, San Ramon, CA (US); Patrick K. Cheung, Sunnyvale, CA (US); Cyrus Tabery, Sunnyvale, CA (US); Jean Y. Yang, Sunnyvale, CA (US); Ning Cheng, Cupertino, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 126 days.

(21) Appl. No.: 10/770,260

(22) Filed: Feb. 2, 2004

(51) Int. Cl.
 *H01L 29/788* (2006.01)
(52) U.S. Cl. ..................... 257/315; 257/316
(58) Field of Classification Search ............. 257/315, 257/316, 294, 435, 437, 652
 See application file for complete search history.

(56) References Cited

U.S. PATENT DOCUMENTS

| | | | |
|---|---|---|---|
| 5,863,462 A | 1/1999 | Riedel et al. | 252/315.1 |
| 5,935,705 A | 8/1999 | Chen et al. | 428/367 |
| 6,090,358 A | 7/2000 | Chen et al. | 423/324 |
| 6,198,216 B1 | 3/2001 | Kosa et al. | 313/503 |
| 6,444,568 B1 | 9/2002 | Sundararajan et al. | 438/627 |
| 6,475,895 B1 | 11/2002 | Mei et al. | 438/597 |
| 6,794,248 B2 * | 9/2004 | Hashimoto et al. | 438/258 |
| 2001/0046731 A1 | 11/2001 | San et al. | 438/230 |
| 2003/0096475 A1 | 5/2003 | Bloom et al. | 438/257 |

OTHER PUBLICATIONS

Liew; "Fabrication of SiCN Ceramic MEMS Using Injectable Polymer-Precursor Technique"; Sensors and Actuators A 89 (2001) 64-70.
Liew; "Fabrication of Multi-Layered SiCN Ceramic MEMS Using Photo-Polymerization of Precursor"; NSF Center for Advanced Manufacturing and Packaging of Microwave, Optical and Digital Electronics (CAMPmode), Department of Mechanical Engineering, University of Colorado.
Liew; "Fabrication:of SiCN MEMS by Photopolymerization of Pre-Ceramic Polymer"; Sensors and Actuators A 95 (2002) 120-134.
Wei et al.; "Growth of SiCN Films by Magnetron Sputtering"; 2000 IoM Communications Ltd. Surface Engineering, 2000, 16, (2), 225-228.
Product Data Sheet; Ceraset™ Polyureasilazane; Product Sheet Issue Date: Jan. 19, 2001.
Claims from U.S. Appl. No. 10/358,589, filed Feb. 5, 2003.

* cited by examiner

*Primary Examiner*—David Nelms
*Assistant Examiner*—Thinh T Nguyen
(74) *Attorney, Agent, or Firm*—Renner, Otto, Boisselle & Sklar, LLP

(57) ABSTRACT

A method of protecting a charge trapping dielectric flash memory cell from UV-induced charging, including fabricating a charge trapping dielectric flash memory cell in a semiconductor device; depositing and planarizing an interlevel dielectric layer over the charge trapping dielectric flash memory cell and depositing over the planarized interlevel dielectric layer at least one UV-protective layer, the UV-protective layer including a substantially UV-opaque material.

9 Claims, 5 Drawing Sheets

FLASH MEMORY CELL WITH UV PROTECTIVE LAYER

TECHNICAL FIELD

The present invention relates to a process for preparation of a charge trapping dielectric flash memory device including an improved contact integration and enhanced interlevel dielectric (ILD) chemical mechanical polishing (CMP) process and a device including such process in its fabrication.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important charge storage material for EEPROM devices is a charge storage layer in a charge trapping dielectric, for example, silicon nitride in an oxide-nitride-oxide (ONO) structure. One EEPROM device that utilizes a charge trapping dielectric charge storage layer is a silicon-oxide-nitride-oxide-silicon (SONOS) type cell. In other such devices, the charge storage is in a charge trapping dielectric layer, but the materials of the various layers may vary from those used in SONOS devices. That is, the silicon, the oxide and/or the nitride of the respective layers may be replaced with another material. For example, silicon may be replaced by germanium or silicon-germanium, oxide and/or nitride may be replaced by, e.g., a high-K dielectric material. Such devices, as well as the SONOS device, are generally included within the designation "charge trapping dielectric flash memory" device, as used herein.

In charge trapping dielectric devices, during programming, electrical charge is transferred from the substrate to the charge storage layer in the charge trapping dielectric of the device, e.g., the nitride layer in a SONOS device. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the charge storage layer. This jump is known as hot carrier injection (HCI), the hot carriers being electrons. Electrons are trapped near the drain region because the electric fields are the strongest near the drain. Reversing the potentials applied to the source and drain will cause electrons to travel along the channel in the opposite direction and be injected into the charge storage layer near the source region. Because the charge storage layer material is not electrically conductive, the charge introduced into the charge storage layer tends to remain localized. Accordingly, depending upon the application of voltage potentials, electrical charge can be stored in discrete regions within a single continuous charge storage layer.

Non-volatile memory designers have taken advantage of the localized nature of electron storage within a charge storage layer and have designed memory circuits that utilize two or more regions of stored charge within the charge storage layer. This type of non-volatile memory device is known as a dual-bit or multi-bit EEPROM. A dual-bit EEPROM is available under the trademark MIRRORBIT™ from Advanced Micro Devices, Inc., Sunnyvale, Calif. The MIRRORBIT™ dual-bit EEPROM is capable of storing twice as much information as a conventional EEPROM in a memory array of equal size. A left bit and a right bit are stored in physically different areas of the silicon nitride layer, in left and right regions of each memory cell, respectively. The above-described programming methods are used to enable the two bits to be programmed and read simultaneously. Each of the two bits of the memory cell can be individually erased by applying suitable erase voltages to the gate and to either the source or drain regions. The multi-bit memory cells recently have been developed, in which more than two bits can be stored in separate regions of a single charge storage layer of the flash EEPROM memory cell. As used herein, the term "dual-bit" refers to both dual-bit and higher-bit memory cells, unless otherwise specifically stated.

A key concept associated with the charge trapping dielectric flash memory device is that for the device to operate properly, both bits must be able to be written and read separately. If one of the bits is programmed, a reverse read on the programmed bit must sense a high $V_t$, i.e., a "0", and a reverse read on the non-programmed bit must sense a low $V_t$, i.e., a "1". Thus, a reverse read on the non-programmed bit, which is equivalent to a forward read on the pro-grammed bit, must punch through the region of trapped charge in order to generate a high enough read current. If this does not happen, the non-programmed bit will not be able to be read as a "1", i.e., a conductive bit.

One problem which has been encountered with charge trapping dielectric flash memory devices including a charge storage layer is the buildup of charge in the charge storage layer, and subsequent increases in $V_t$, as a result of exposure to ultraviolet radiation during fabrication, and particularly in Back End Of Line (BEOL) process steps, i.e., following formation of the flash memory cell. Processes which include high levels of UV radiation cause such charge buildup and concomitant increase in $V_t$. This increase in $V_t$ would make all the bits appear to be high, i.e., "0". In addition, if the charge buildup is sufficiently large, it cannot be easily erased by the available voltages. As a result, the charge trapping dielectric device would be rendered useless as a charge storage device.

UV exposure is not a problem for floating gate flash devices which have a polysilicon or other conductive material for a charge storage element. In such devices, the floating gate may be purposely exposed to UV radiation, in order to neutralize any electronic charge which builds up on the floating gate memory cell during processing. For example, U.S. Pat. No. 6,350,651 uses UV radiation in this manner.

Such processing is not an option for charge trapping dielectric flash memory devices, since the charge storage layer can be irreversibly damaged by exposure to UV radiation which builds up a large charge, and the charge cannot be neutralized by further exposure to UV radiation.

One proposed solution is to deposit over the interlevel dielectric (ILD) one or more layers that block a significant amount of UV radiation from reaching the charge storage layer, e.g., a UV blocking layer. The ability of the UV blocking layer to block harmful radiation is directly related to the variation in thickness of the UV blocking layer. Further, a smooth surface of the UV blocking layer is necessary to maintain photolithographic depth of focus for subsequent steps and also to ensure that contacts are formed over the source/drain regions. Conventional chemical mechanical polishing alone of the surface of the ILD layer results in significant variations in the thickness of the ILD surface, i.e., the surface topography, that significantly reduces the ability of the UV blocking layer to shield the charge storage layer and the ability to form with precision subsequent device features such as contacts. That is, the surface topography of the ILD layer is directly related to the device features it is formed over. For example, the surface topography increases significantly in height (thickness) over a SONOS device relative to the surface topography over a featureless semiconductor substrate. Although a conventional CMP process will reduce the variation in thickness of the ILD surface, depressions in the ILD will remain because the ILD layer is of the same material.

Therefore, a need exists for a method which will increase the planarization of the surface of the ILD, i.e., significantly reduce the thickness variations in the topography of the ILD. Further, there exists a need for a method which benefits from the increased planarization of the ILD and provides a device which includes protection of the charge storage layer in charge trapping dielectric devices from exposure to UV radiation during BEOL processing. Accordingly, advances in such fabrication technology are needed to insure that charge buildup and increase in $V_t$, in charge trapping dielectric structures does not occur, particularly during BEOL processing.

DISCLOSURE OF INVENTION

The present invention, in one embodiment, relates to a method of planarizing an interlevel dielectric layer including the steps of fabricating a semiconductor device on a semiconductor substrate, depositing an interlevel dielectric layer over the semiconductor device, depositing a sacrificial layer over the interlevel dielctric layer, and planarizing the interlevel dielectric layer and the sacrificial layer to form a planarized interlevel dielectric layer including at least one portion of the sacrificial layer in a thickness variation of the interlevel dielectric layer, the at least one portion of the sacrificial layer reduces the thickness variation in the interlevel dielectric layer.

In one embodiment, the present invention relates to a semiconductor device including a charge trapping dielectric flash memory cell, at least one UV-protective layer, the UV-protective layer comprises a substantially UV-opaque materia, and a interlevel dielectric layer including a portion of a sacrificial layer in a thickness variation of the interlevel dielectric layer, the portion of the sacrificial layer reduces the thickness variation in the interlevel dielectric layer.

In another embodiment, the present invention relates to a semicondutor device including a charge trapping dielectric flash memory cell, a interlevel dielectric layer including at least one portion of a sacrificial layer in a thickness variation of an interlevel dielectric layer, a UV-protective contact cap layer disposed over the planarized interlevel dielectric layer, the UV-protective contact cap layer comprising a substantially UV-opaque material, and at least one additional UV-protective layer, the at least one additional UV-protective layer comprising at least a sub-layer of a UV-opaque material, wherein each UV-opaque material comprises one or more of silicon-rich nitride, silicon-rich silicon oxide, silicon-rich carbide, silicon-rich SiCN, carbon polymers, low-k materials, graded films and thin metal films, and wherein the UV-protective layers protect the charge trapping dielectric flash memory cell from damage resulting from UV exposure during BEOL processing in fabrication of the charge trapping dielectric flash memory device.

Thus, the present invention, by providing a method for reducing the thickness variations in the topography of the ILD upon which a UV-protective layer is formed, overcomes the problem of UV-induced charging of charge trapping dielectric flash memory cells, particularly during BEOL processing. The present invention provides advantages such as (1) formation of a UV-protective layer which protects the device from BEOL UV radiation; (2) protection of the charge trapping dielectric flash memory cell from UV-induced charging; (3) provision of a process modification which can be easily accommodated in presently employed fabrication processes; (4) formation of the UV-protective layer with reduced variation in thickness; (5) precision formation of subsequent device features such as contacts; and (6) formation of one or more of a contact cap layer, interlevel dielectric layers, and a top oxide with this additional function in addition to standard dielectric functions. Thus, the present invention provides an advance in ONO fabrication technology, and insures proper charge isolation in ONO structures in charge trapping dielectric flash memory devices, while at the same time providing distinct process and economic advantages. Although described in terms of, and particularly applicable to, charge trapping dielectric flash memory devices, the present invention is broadly applicable to fabrication of any semiconductor device that includes a charge storage layer subject to unwanted UV charging.

Figure 1:
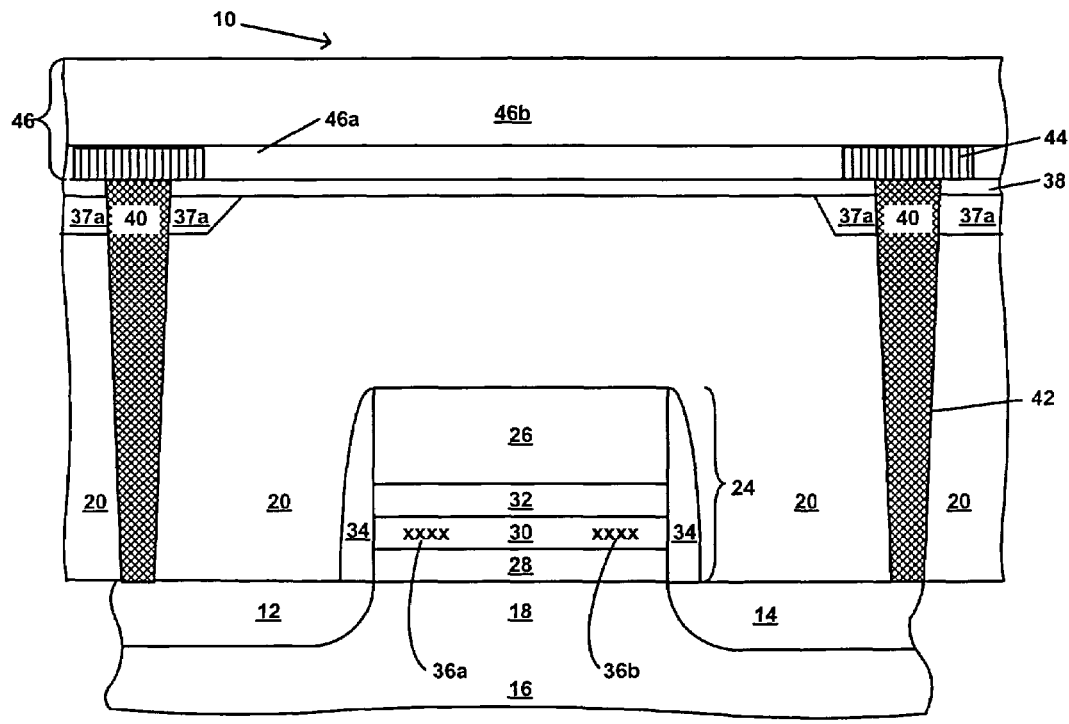
FIG. 1 schematically illustrates, in cross-section, a portion of a semiconductor substrate containing a Dual-Bit EEPROM transistor which incorporates a substantially planarized ILD layer, a substantially UV-opaque contact cap layer, and which further includes a further UV-protective layer having a substantially UV-opaque sub-layer, fabricated in accordance with an embodiment of the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

Referring first to FIG. 1, there is schematically shown in cross-section a transistor 10, which in one embodiment is a charge trapping dielectric flash memory cell, suitable for use in a dual-bit EEPROM device, such as the MIRRORBIT™. The transistor 10 includes source/drain regions 12 and 14 located in a semiconductor substrate 16 and separated by a channel region 18. The substrate 16 may be, for example, a single crystal silicon wafer. The substrate 16 may also be gallium arsenide, a silicon-on-insulator layer, an epitaxial layer, a silicon-germanium layer, a germanium-on-insulator layer, or other known semiconductor substrate. A stack gate 24 overlies the channel region 18. The stack gate 24 includes a control gate electrode 26, and an ONO structure including a bottom or tunnel oxide layer 28, a charge storage layer 30 and a top oxide layer 32, as shown in FIG. 1. In one embodiment, the charge storage layer 30 is a nitride containing charge storage layer. In one embodiment, the charge storage layer 30 comprises silicon nitride. In other embodiments, the charge storage layer 30 comprises other known dielectric charge storage materials such as, for example, a high-K dielectric material. Suitable high-K dielectric charge storage materials are disclosed in copending, commonly assigned application assigned U.S. Ser. No. 10/036,757, entitled USE OF HIGH-K DIELECTRIC MATERIALS IN MODIFIED ONO STRUCTURE FOR SEMICONDUCTOR DEVICES. The stack gate 24 further includes sidewall liners 34. As shown in FIG. 1, charges 36a and 36b may be stored in the charge storage layer 30, which acts as a charge or electron storage layer in the charge trapping dielectric flash memory device or Dual-Bit EEPROM device.

Referring still to FIG. 1, the stack gate 24 is covered and surrounded by a first interlevel dielectric (ILD) layer 20, which also may be referred to as IDL0 ("ILD zero") layer 20. In one embodiment, the ILD0 layer 20 is silicon dioxide. In other embodiments, the ILD0 layer 20 may comprise other materials, such as boron phosphosilicate glass (BPSG) or other known materials for such layer. In the embodiment shown in FIG. 1, the ILD0 layer 20 is thicker than the height of the stack gate 24.

Figure 4A:
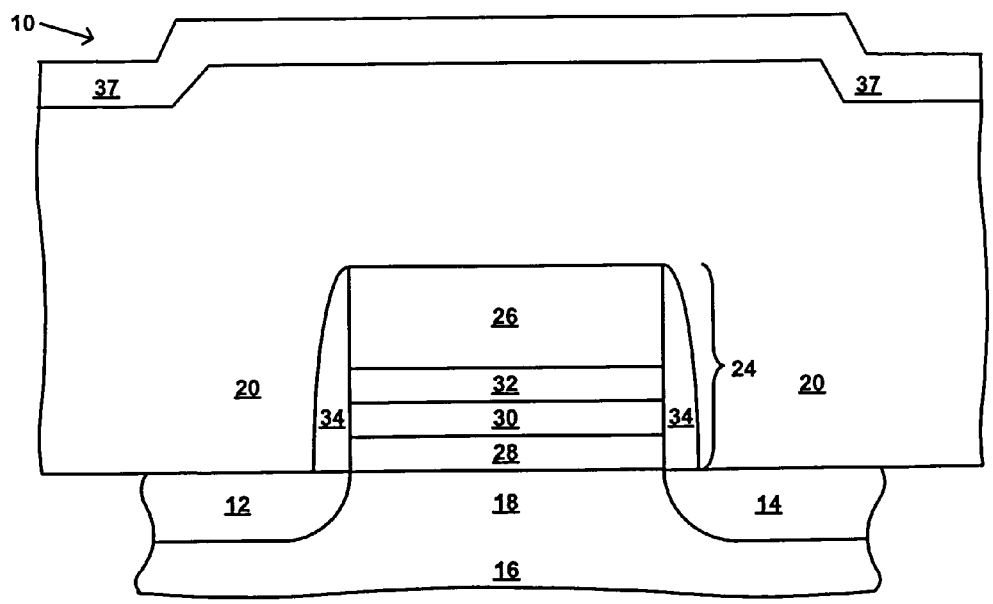
FIGS. 4a–4c illustrate, in cross-section, process steps for the fabrication of the substantially planarized ILD layer.

The first ILD layer 20 is covered with a sacrificial layer 37 (FIG. 4a). The sacrificial layer 37 is chemically mechanically polished to remove the sacrificial layer 37 from the thicker surfaces of the first ILD layer 20 relative to the adjacent surfaces of the first ILD layer 20. Accordingly, portions of the sacrificial layer 37a remain in depressions in the surface of the first ILD layer 20, as described in more detail. Thus, a planarized ILD layer 20 and 37a is formed. As a result, the variation in thickness of the surface topography of the first ILD layer 20 is significantly reduced. In an embodiment, the thickness variation is reduced between about 30% and 80%. In an embodiment, the thickness variation is reduced between about 40% and 70%. In an embodiment, the thickness variation is reduced between about 50% and 60%.

In one embodiment, the sacrificial layer 37 comprises one or more of a silicon nitride, a silicon oxynitride, a silicon carbide, a silicon carbide-nitride, a silicon-rich nitride, silicon-rich oxide, silicon-rich carbide, silicon-rich carbide-nitride, carbon polymers, low-k materials, graded films or thin metal films. The sacrificial layer 37 may be deposited by a variety of process techniques, e.g., thermal, CVD, LPCVD, APCVD, etc.

The planarized first ILD layer 20 is covered by an contact cap layer 38. The contact cap layer 38 may also be referred to as a "C1" layer. In one embodiment, the contact cap layer 38 comprises a silicon-rich material which absorbs UV radiation. In one embodiment, the contact cap layer 38 comprises a substantially UV-opaque material such as a silicon-rich nitride, silicon-rich oxide, silicon-rich carbide, silicon-rich carbide-nitride, carbon polymers, low-k materials, graded films or thin metal films. In one embodiment, the contact cap layer 38 comprises one or more of silicon-rich silicon dioxide, silicon-rich silicon nitride, silicon-rich silicon carbide, silicon-rich silicon carbide-nitride, carbon polymers, low-k materials, graded films or thin metal films. The contact cap layer 38 may be deposited by a variety of process techniques, e.g., CVD, LPCVD, APCVD, etc. In one illustrative embodiment, the contact cap layer 38 is comprised of a layer of silicon-rich silicon nitride that is formed by a CVD process. In one embodiment, the substantially UV-opaque contact cap layer 38 provides protection to the transistor 10 from UV radiation which may impinge upon the transistor 10 during processing subsequent to the formation of the stack gate 24 of the transistor 10. In one embodiment, the contact cap layer 38 is sufficiently UV opaque to block at least about 95% of incident UV radiation. In another embodiment, the contact cap layer 38 is sufficiently UV opaque to block at least about 98% of incident UV radiation. And in another embodiment, the contact cap layer 38 is sufficiently UV opaque to block at least about 99% of incident UV radiation. In another embodiment, the contact cap layer 38 is used as an layer during an etch step. The silicon-rich materials of which the contact cap layer 38 is comprised are described in more detail below.

In one embodiment (not shown), the contact cap layer 38 comprises a first, substantially UV opaque sub-layer, and a second sub-layer which comprises a material which is not UV opaque. The embodiment of the contact cap layer 38 having the first, substantially UV opaque sub-layer and the second sub-layer is substantially similar to the layers described below with respect to the UV-protective layer 46, except that the total thickness of the layers may be less. In one embodiment, the first, substantially UV opaque sub-layer of the contact cap layer 38 may be substantially thicker than the second sub-layer. In one embodiment, due to the relatively small total thickness of the contact cap layer 38, a second sub-layer is not present. In one embodiment, the contact cap layer 38 comprises only a single, substantially UV-opaque layer.

Figure 2:
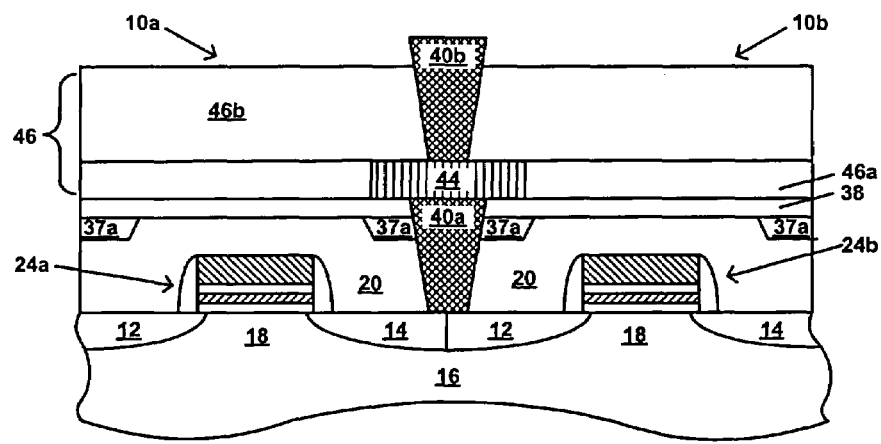
FIG. 2 schematically illustrates, in cross-section, a portion of a semiconductor substrate containing a pair of Dual-Bit EEPROM transistors which incorporates a substantially planarized ILD layer, a substantially UV-opaque sub-layer in a UV-protective layer, fabricated in accordance with an embodiment of the present invention.

Referring still to FIG. 1, the transistor 10 further includes conductive connecting plugs 40, which may be, for example, tungsten plugs, copper plugs or the like. The conductive plugs 40 are formed in apertures 42 in the planarized ILD0 layer 20. The apertures 42 penetrate through the planarized ILD0 layer 20, providing a path or via to the source/drain region 12 and/or source/drain region 14 of the transistor 10. The transistor 10 further comprises electrodes 44, which may be, for example, metal such as copper. The electrodes 44 may be, for example, connecting elements (e.g., bit lines, etc.) of the transistor 10 to power sources and adjacent transistors. The conductive plugs 40 in FIG. 1 provide electrical connection between the electrodes 44 and the source/drain region 12 and/or the source/drain region 14. In one embodiment, as shown in FIG. 2, the conductive plugs 40 provide electrical connection both to the source/drain region 12 of one transistor 10, and to the source/drain region 14 of an adjacent transistor.

In the operation of the exemplary dual-bit EEPROM transistor 10, voltages are applied to the gate electrode 26 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 28 into the silicon nitride charge storage layer 30. The charge storage layer may also be referred to as an electron storage layer, or ESL. For example, depending upon the particular voltage levels applied to the control-gate electrode 26 and to the source/drain regions 12 and 14, the electrical charges 36a, 36b are transferred into the charge storage layer 30 and are localized to regions in proximity to either the source/drain region 12, or the source/drain region 14.

Those skilled in the art will recognize that for proper functioning of a dual-bit EEPROM device, the electrical charges 36a, 36b should remain isolated in the regions of the charge storage layer 30 to which they are initially introduced, and no charge should be present prior to programming of the charge storage layer 30. The proper maintenance of the condition, either programmed or not programmed, of the charge storage layer 30 is needed for the proper performance of a dual-bit EEPROM device. In particular, the charge storage layer 30 should be protected from incident UV radiation which can create a charge in the charge storage layer 30. As described above, such spuriously created charges can introduce errors into stored data and even damage the charge storage layer 30.

In accordance with the invention, unwanted charge buildup in the charge storage layer 30 from incident UV radiation is minimized by forming a UV-protective layer over a substantially planarized ILD layer as described herein. The protection from spurious charges in and the improved performance of dual-bit EEPROM devices obtained by the present invention can be better understood following a description of a fabrication process for the structures described above in accordance with the invention.

In the embodiment shown in FIG. 1, the transistor 10 is covered by a UV-protective layer 46. In one embodiment, the UV-protective layer 46 is a second interlevel dielectric layer, designated ILD1. The UV-protective layer 46 includes a first, substantially UV opaque liner or sub-layer 46a and a second sub-layer 46b. In one embodiment, the second sub-layer 46b is substantially thicker than the first sub-layer 46a, thus the first sub-layer 46a may also be referred to as a liner. In one embodiment, the first, substantially UV opaque sub-layer 46a provides protection to the transistor 10 from UV radiation which may impinge upon the transistor 10 during processing subsequent to the formation of the stack gate 24 of the transistor 10. In one embodiment, the first sub-layer 46a is sufficiently UV opaque to block at least about 95% of incident UV radiation. In another embodiment, the first sub-layer 46a is sufficiently UV opaque to block at least about 98% of incident UV radiation. And in another embodiment, the first sub-layer 46a is sufficiently UV opaque to block at least about 99% of incident UV radiation.

As used herein, the term "substantially UV opaque" means that the layer so described blocks at least about 90% of the incident UV light. As used herein, the term "substantially not UV opaque" means that the layer so described passes a major amount of the incident UV radiation without absorption thereof. As used herein, the term "substantially UV transparent" means that the layer so described passes at least about 75% of the incident UV radiation without absorption thereof. Such terms do not mean that the material has no effect on the UV radiation, such as shifts in phase, wavelength or other properties.

The first sub-layer 46a comprises a silicon-rich material which absorbs UV radiation. In one embodiment, the silicon-rich material is substantially UV-opaque as defined herein. In one embodiment, the first sub-layer 46a comprises one or more of silicon-rich silicon dioxide, silicon-rich silicon nitride, silicon-rich silicon carbide, silicon-rich carbide-nitride, carbon polymers, low-k materials, graded films or thin metal films.

In one embodiment, the first sub-layer 46a comprises silicon-rich silicon dioxide. As is known in the art, pure or stoichiometric silicon dioxide is substantially transparent to UV radiation, including UV radiation in the range from near-UV radiation having a wavelength of about 400 nm, to UV radiation having a wavelength of about 200 nm. However, increasing the silicon content of silicon dioxide above a stoichiometric ratio increases the refractive index and the UV absorbency of the material. Thus, a silicon-rich silicon dioxide provides enhanced UV blocking capability. As the silicon content is increased, the UV blocking or opacity increases. Thus, in one embodiment, the first sub-layer 46a comprises silicon-rich silicon dioxide, in which the amount of silicon is sufficient to render the first sub-layer 46a substantially UV opaque. In one embodiment, the silicon-rich silicon dioxide has a formula $SiO_x$, wherein x<2. In one embodiment, the silicon-rich silicon dioxide has a formula $SiO_x$, wherein $1.8 \leq x \leq 1.99$. In one embodiment, the silicon-rich silicon dioxide has a formula $SiO_x$, wherein $1.88 \leq x \leq 1.95$. Further, the addition of silicon to silicon dioxide increases the etch selectivity of the layer relative to silicon. The amount of silicon added to the film can be tailored to control the etch selectivity of the film. Accordingly, the silicon rich film can be used as an layer during an etch step of the fabrication process.

In general, the silicon-rich forms of the materials used in the UV-protective layers, including the contact cap layer 38, have a higher refractive index that the corresponding non-silicon-rich forms of the same materials. In general, enrichment of the silicon content of these materials correlates both with increased refractive index and with increased UV opacity in these materials.

As is well known, the refractive index of substantially stoichiometric silicon dioxide is about 1.46. As mentioned above, the refractive index of silicon-rich silicon dioxide is higher than that of silicon dioxide. In one embodiment, the first sub-layer 46a has a refractive index in the range from about 1.5 to about 1.8. In another embodiment, the refractive index of the first sub-layer 46a is about 1.55 to about 1.75. In another embodiment, the refractive index of the first sub-layer 46a is about 1.6 to about 1.7, and in one embodiment, the refractive index of the first sub-layer 46a is greater than about 1.6.

Here, and throughout the specification and claims, the limits of the ranges and ratios may be combined. Thus, for example, in the foregoing ranges of refractive index, although the range from about 1.6 to about 1.8 is not specifically recited, such range is within the scope of the disclosure.

In one embodiment, the first sub-layer 46a comprises silicon-rich silicon nitride. Silicon nitride, in its non-silicon-rich, stoichiometric form is generally assigned the empirical formula $Si_3N_4$. Silicon-rich silicon nitride comprises a Si-enriched form of silicon nitride. Thus, if the formula for silicon-rich silicon nitride is written as $Si_xN_4$, the value of x is greater than 3. In one embodiment, $3.01 \leq x \leq 4$. In one embodiment, the value of x ranges from greater than 3, i.e., from about 3.01 to about 4. In one embodiment, the value of x ranges from about 3.1 to about 3.8, and in another, from about 3.15 to about 3.6.

In one embodiment, the first sub-layer 46a comprises silicon-rich silicon carbide, SiC. Silicon carbide is generally assigned the empirical, stoichiometric formula SiC. Silicon-rich SiC comprises a Si-enriched SiC relative to stoichiometric SiC. Thus, if silicon carbide is represented as $Si_aC_b$, in silicon-rich SiC, a>b, and a+b=2, whereas in stoichiometric SiC, a is substantially equal to b, i.e., a≈b, and a+b=2. In one embodiment, in silicon-rich SiC, a ranges from 1.01 to about 1.2, and a+b=2. In one embodiment, in silicon-rich SiC, a ranges from 1.02 to about 1.1, and a+b=2. Thus, in non-silicon-rich SiC, a ranges from greater than 0.99 to less than 1.01 and b=2−a.

In one embodiment, the first sub-layer 46a comprises silicon-rich SiCN. SiCN has been referred to under various names, such as silicon carbon nitride, silicon carbonitride and silicon cyanide. The empirical formula of SiCN varies depending on the formation conditions, but is generally considered to be analogous to $Si_3N_4$ and $C_3N_4$, in which the Si and C components are interchanged. The formula of the "interchanged" Si and C has been sometimes referred to as $(Si;C)_3N_4$. Herein, this material will be referred to simply as SiCN. Silicon-rich SiCN contains a major proportion of Si and a minor proportion of C, and non-silicon-rich SiCN contains a minor proportion of SI and a major proportion of C. Thus, SiCN may be considered to have a general formula $Si_xC_yN_4$. Using this formula, in silicon-rich SiCN, x>1.5 and y<1.5, and non-silicon-rich SiCN, $x \leq 1.5$ and $y \geq 1.5$. In one embodiment, in silicon-rich SiCN, x ranges from greater than 1.5 to about 2.5, and y ranges from about 0.5 to less than 1.5. In one embodiment, in silicon-rich SiCN, x ranges from about 1.55 to about 2.25, and y ranges from about 0.75 to about 1.45.

In one embodiment, silicon-rich SiCN comprises a super-stoichiometric quantity of Si, relative to the C and N. The SiCN with the super-stoichiometric quantity of Si has a total amount of Si and C which exceeds the quantity of Si and C needed to be stoichiometrically equivalent to the quantity of N. The increase is obtained by providing Si enrichment of the SiCN. In this embodiment, for example, if y=1.5, x>1.5. Thus, based on the amount of C and N in the SiCN, the content of Si is enriched. In other words, once the content of C relative to N is determined, rather than the stoichiometric quantity of Si being included, in this embodiment, in silicon-rich SiCN, the content of Si is higher than the stoichiometric quantity needed, thus it has a super-stoichiometric Si content.

In one embodiment, the silicon-rich material in the first sub-layer 46a absorbs UV radiation in the UV range from about 450 nm to about 190 nm. In one embodiment, the silicon-rich material in the first sub-layer 46a absorbs UV radiation in the UV range from about 400 nm to about 200 nm. In one embodiment, the silicon-rich material in the first sub-layer 46a absorbs UV radiation in the UV range from about 390 nm to about 210 nm.

In one embodiment, UV absorption or percent transmittance (% T) is measured in a Hewlett-Packard UV spectrophotometer at a wavelength of 254 nm. Measurement of UV radiation at this wavelength provides a good estimate of the absorption of UV radiation generally.

In one embodiment, the second sub-layer 46b comprises a non-silicon-rich form of the material of the first sub-layer. Thus, for example, in an embodiment in which the first sub-layer 46a comprises silicon-rich silicon dioxide, the second sub-layer 46b comprises non-silicon-rich, or substantially stoichiometric, silicon dioxide. Similarly, in an embodiment in which the first sub-layer 46a comprises silicon-rich silicon nitride, the second sub-layer 46b comprises non-silicon-rich, or substantially stoichiometric, silicon nitride. Likewise, in an embodiment in which the first sub-layer 46a comprises silicon-rich silicon carbide, the second sub-layer 46b comprises non-silicon-rich, or substantially stoichiometric, silicon carbide. And similarly, in an embodiment in which the first sub-layer 46a comprises silicon-rich SiCN, the second sub-layer 46b comprises non-silicon-rich, or substantially stoichiometric, SiCN.

In one embodiment, the second sub-layer 46b is not UV-opaque. In one embodiment, the second sub-layer 46b is substantially UV transparent, down to a wavelength of about 200 nm. In one embodiment, the second sub-layer 46b absorbs at least some high energy UV radiation, that is, UV radiation having a wavelength in the range from about 254 nanometers (nm) down to about 200 nm, or to about 190 nm.

In one embodiment, the second sub-layer 46b is silicon dioxide. In one embodiment, the second sub-layer 46b is silicon dioxide having a general formula $SiO_x$, wherein $x \geq 2$. In one embodiment, the second sub-layer 46b is silicon dioxide having a general formula $SiO_2$, i.e., a substantially stoichiometric silicon dioxide. In another embodiment, the second sub-layer 46b is non-silicon-rich silicon nitride, $Si_3N_4$, i.e., a substantially stoichiometric silicon nitride. In another embodiment, the second sub-layer 46b is non-silicon-rich silicon carbide, SiC, as defined above. In another embodiment, the second sub-layer 46a is non-silicon-rich SiCN, as defined above.

FIG. 2 shows a second schematic view of a pair of adjacent transistors 10a and 10b. As in the embodiment shown in FIG. 1, the embodiment shown in FIG. 2 includes a semiconductor substrate 16, upon which have been formed two adjacent transistors 10a and 10b. Each transistor 10a, 10b includes, a source/drain region 12, a source/drain region 14 and a channel region 18. Formed above the channel region 18 of each respective transistor 10a, 10b is a stack gate 24a, 24b, such as that described in more detail with respect to the transistor 10 of FIG. 1. As in FIG. 1, each transistor 10a, 10b in FIG. 2 includes a first interlevel dielectric layer 20, designated ILD0 layer 20, which covers and surrounds each of the stack gates 24a, 24b. As in FIG. 1, the ILD0 layer 20 has been planarized by CMP of a sacrificial layer 37 deposited thereon. Thus, the depressions in the surface of the ILD layer 20 are filled with portions 37a the sacrificial layer 37. Accordingly, the thickness variation in the topography of the ILD layer has been significantly reduced, as described above. The planarized ILD0 layer 20 is covered by a contact cap layer 38. In one embodiment, the contact cap layer 38 is a UV-blocking layer.

FIG. 2 illustrates a first conductive plug 40a, an electrode 44 and a second conductive plug 40b. In the embodiment of FIG. 2, the conductive plug 40a provides an electrical connection between the metal conductor 44 and adjacent source/drain region 14 and source/drain region 12 of two adjacent transistors 10a, 10b. FIG. 2 illustrates a second conductive plug 40b, which provides an electrical connection from an external source (not shown) to the electrode 44.

As shown in FIG. 2, the contact cap layer 38 is covered by a UV-protective layer 46. In one embodiment, the UV-protective layer 46 shown in FIG. 2 is a second interlevel dielectric layer, designated ILD1. The UV-protective layer 46 comprises a first substantially UV-opaque sub-layer 46a, and a second sub-layer 46b. In one embodiment, as described above with respect to FIG. 1, the second sub-layer 46b is substantially UV transparent, and in one embodiment, the second sub-layer 46b is substantially not UV opaque. The description provided above with respect to the UV-protective layer 46 embodiment shown in FIG. 1 is fully applicable in all respects to the embodiment of FIG. 2, so is not repeated here.

Due in part to the planarized ILD0 layer 20 and 37a, the above described device features can be formed with increased precision. For example, the contact 40b can be formed with increased accuracy over the electrode 44. Further, the dimensions of the contact can be formed more precisely. That is, the planarized ILD0 layer allows subsequent layers to be formed with less variation in thickness thus maintaining photolithographic depth of focus for subsequent steps.

Figure 3:
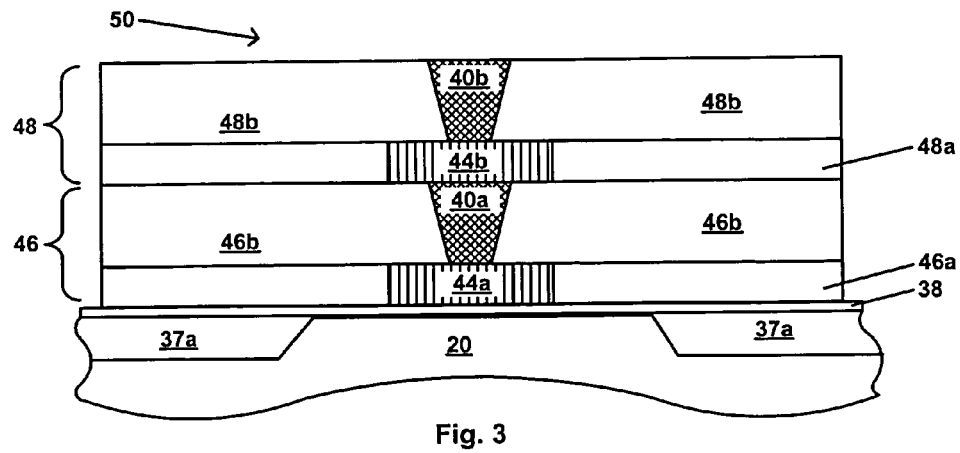
FIG. 3 schematically illustrates, in cross-section, a portion of a semiconductor substrate which incorporates a substantially planarized ILD layer, two UV-protective layers each of which includes a substantially UV-opaque sub-layer, fabricated in accordance with an embodiment of the present invention.

FIG. 3 schematically illustrates another embodiment of the present invention. FIG. 3 shows a portion of a semiconductor device 50, which may include, for example, a transistor such as those described with respect to FIGS. 1 and 2. The structure shown in FIG. 3 depicts layers applied during BEOL processing. The device 50 includes a first interlevel dielectric layer 20 (ILD0 layer 20), which may be disposed in a layer covering a stack gate (not shown) or other structure of a semiconductor device. The ILD0 layer 20 of FIG. 3 is substantially the same as that described above with respect to the embodiments shown in FIGS. 1 and 2. That is, the ILD0 layer 20 includes a portion 37a of a sacrificial layer 37 used in the plarization of the ILD0 layer 20 (planarized layer 20 and 37a). The device 50 further includes a contact cap layer 38, which is substantially the same as that described above with respect to the embodiments shown in FIGS. 1 and 2. The device 50 shown in FIG. 3 includes a first conductive plug 40a and a second conductive plug 40b. The device 50 shown in FIG. 3 also includes a first electrode 44a and a second electrode 44b. The first conductive plug 40a provides electrical connection between the first electrode 44a and the second electrode 44b. The second conductive plug 40b provides electrical connection between the second electrode 44b and an external power source or other device (not shown).

The semiconductor device 50 shown in FIG. 3 includes two UV-protective layers. The device 50 includes a first UV-protective ILD layer 46, and a second UV-protective layer 48. In one embodiment, both the first UV-protective ILD layer 46 and the second UV-protective layer 48 are substantially the same as the UV-protective layer 46 described above with respect to FIGS. 1 and 2, with respect to materials, thicknesses, functions, etc.

In one embodiment, the first UV-protective ILD layer 46 shown in FIG. 3 is a second interlevel dielectric layer, designated ILD1. The first UV-protective ILD layer 46 shown in FIG. 3 includes a first substantially UV-opaque sub-layer 46a, and a second sub-layer 46b. In one embodiment, the second sub-layer 46b is substantially UV transparent, and in another embodiment, the second sub-layer 46b is substantially not UV opaque.

In one embodiment, the second UV-protective layer 48 shown in FIG. 3 is a third interlevel dielectric layer, designated ILD2. The second UV-protective layer 48 shown in FIG. 3 includes a second substantially UV-opaque sub-layer 48a, and a second sub-layer 48b. In one embodiment, the second sub-layer 48b is substantially UV transparent, and in another embodiment, the second sub-layer 48b is substantially not UV opaque.

The thickness of the UV-protective layer is, of course, the sum of the thicknesses of the respective sub-layers from which it is formed. In one embodiment, the first sub-layer has a thickness in the range from about 300 angstroms to about 1000 angstroms, and the UV-protective layer has a total thickness of about 4000 angstroms to about 10,000 angstroms. In another embodiment, the first sub-layer has a thickness in the range from about 400 angstroms to about 800 angstroms, and the UV-protective layer has a total thickness of about 5000 angstroms to about 8000 angstroms. In another embodiment, the first sub-layer has a thickness in the range from about 500 angstroms to about 700 angstroms, and the UV-protective layer has a total thickness of about 6000 angstroms to about 7000 angstroms. In another embodiment, the thickness of the first sub-layer 46a is sufficient to absorb incident UV radiation resulting from BEOL processes, including, for example, PECVD, which may be used in depositing subsequent materials on the semiconductor device. In an embodiment in which the UV-protective layer constitutes a single layer, such as in the contact cap layer 38, or in a top oxide layer, the thickness of the UV-protective layer has a thickness in the range from about 300 angstroms to about 1000 angstroms. In another embodiment, the thickness of the first sub-layer 46a is sufficient to be etched to form an opening the size of the electrode 44a resulting from an etch process.

Although the foregoing embodiments of the present invention have been described in detail, as would be understood by persons of ordinary skill in the art, further embodiments of the present invention may include additional UV-protective layers. In some such embodiments, the UV-protective layer may constitute a further interlevel dielectric layer, or ILD, for example an ILD3 layer. In the case of the ILD0 layer, the sub-layer which is substantially UV-opaque is the contact cap layer 38, which in effect is the top or upper layer, rather than the bottom or lower layer, as in the embodiments of the ILD1 and ILD2 layers shown in FIGS. 1–3. In other embodiments, the UV protective layer is a layer other than an interlevel dielectric layer. For example, the UV protective layer may be a top oxide layer. The top oxide layer covers the entire semiconductor device. In one embodiment, both the contact cap layer 38 and a top oxide layer comprise a UV protective layer as described above. In one embodiment, these layers include a UV opaque first sub-layer and a non-UV opaque second sub-layer, as each sub-layer has been described above. In another embodiment, the contact cap layer, and in yet another embodiment, the top oxide layer, respectively comprise a single, UV opaque layer, as opposed to a UV-protective comprising two sub-layers.

Figure 6:
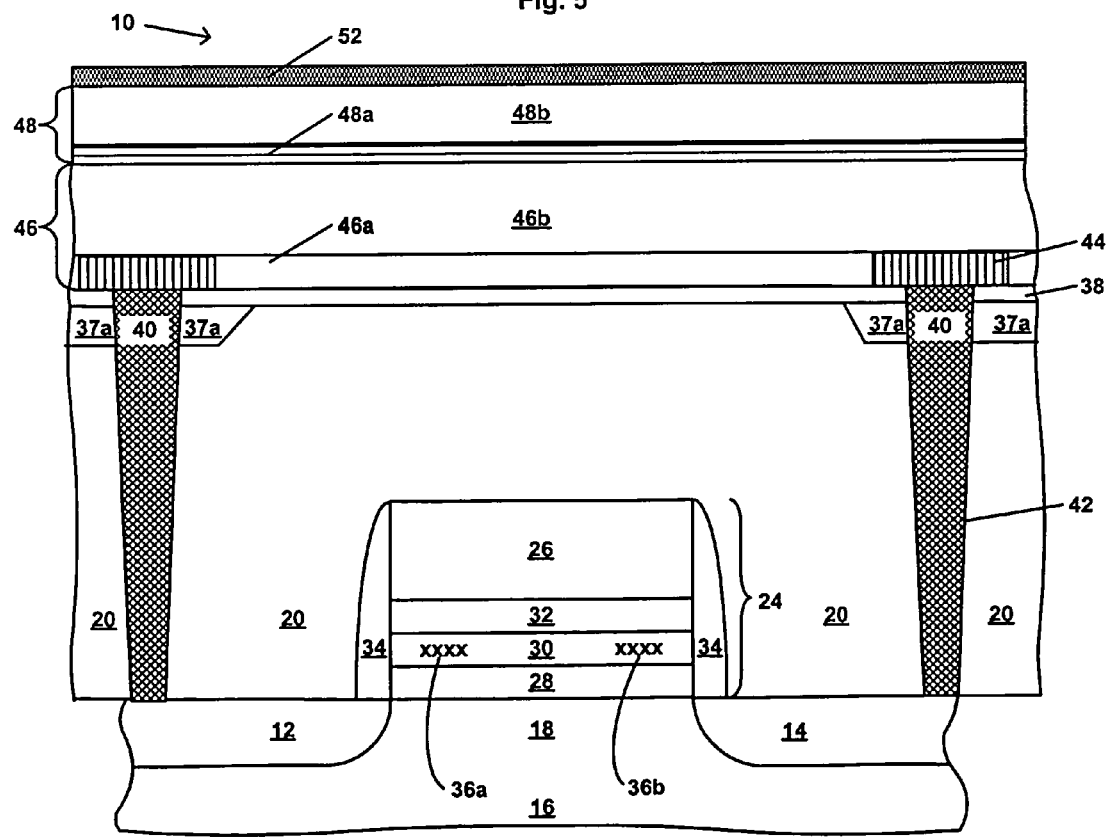
FIG. 6 schematically illustrates, in cross-section, a portion of a semiconductor substrate similar to that of FIG. 1, which incorporates a substantially planarized ILD layer, an contact cap layer, three interlayer dielectric layers and a top oxide layer, fabricated in accordance with an embodiment of the present invention.

Although not shown, the embodiments shown in FIGS. 1–3 may include additional UV-protective layers such as described herein. For example, these embodiments may comprise a UV-protective ILD2 layer, a UV-protective ILD3 layer, and/or a UV-protective top oxide layer, in addition to the UV-protective contact cap layer 38 and/or the UV-protective ILD1 layer 46. Similarly, in one embodiment, the ILD1 layer 46 is not a UV-protective layer, but a subsequent layer, such as an ILD2, ILD3 or top oxide layer, is a UV-protective layer. FIG. 6 shows an embodiment including additional layers, some or all of which may comprise UV-protective layers and/or substantially UV-opaque layers.

Processes for Fabrication of the Device

The following description of the process of the present invention is described in the context of a substantially planarized ILD layer and a UV-protective layer formed thereon suitable for use in a dual-bit EEPROM device, such as the MIRRORBIT™ device. It is to be understood that, while the present invention is discussed herein in that context, that this is merely exemplary and is not intended to limit the scope of the present invention. The substantially planarized ILD layer and the UV-protective layer fabricated thereon by the presently disclosed method is applicable to any semiconductor device in which a flash memory cell is included and which may be susceptible to UV-induced charging or other damage.

Figure 4B:
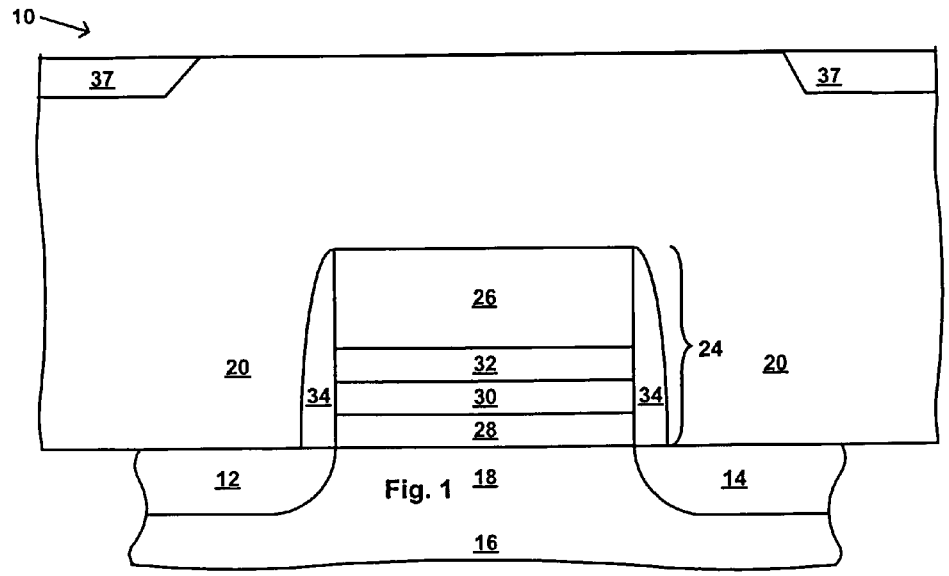
Figure 4C:
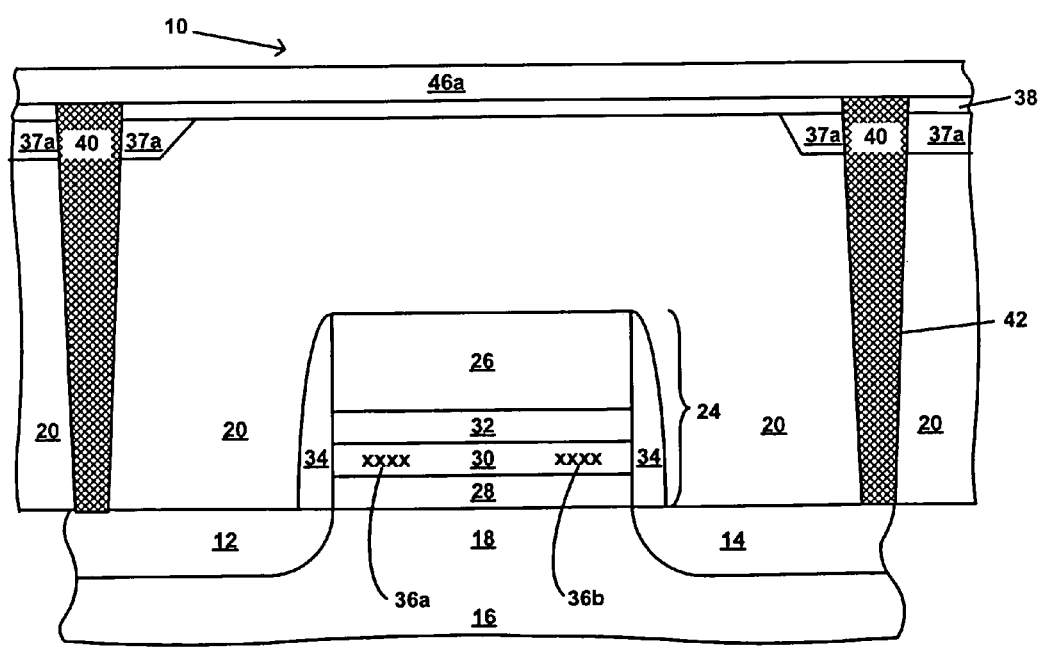
Figure 5:
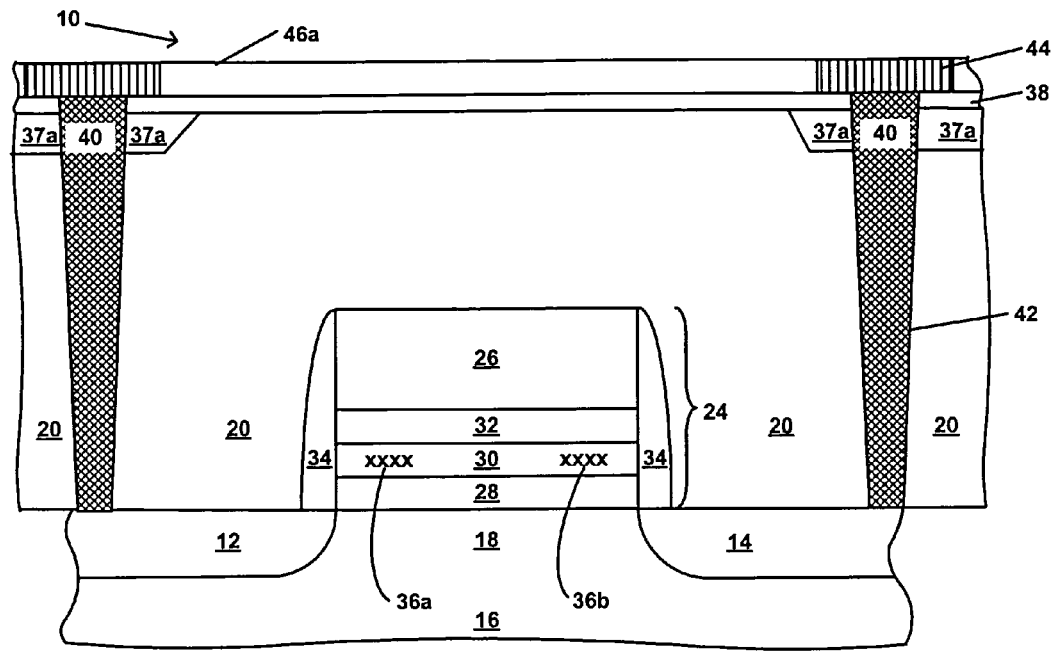
FIG. 5 illustrates, in cross-section, process steps for the fabrication of the UV-protective layers of the present invention on a semiconductor device, in a process in accordance with an embodiment of the present invention.
Figure 7:
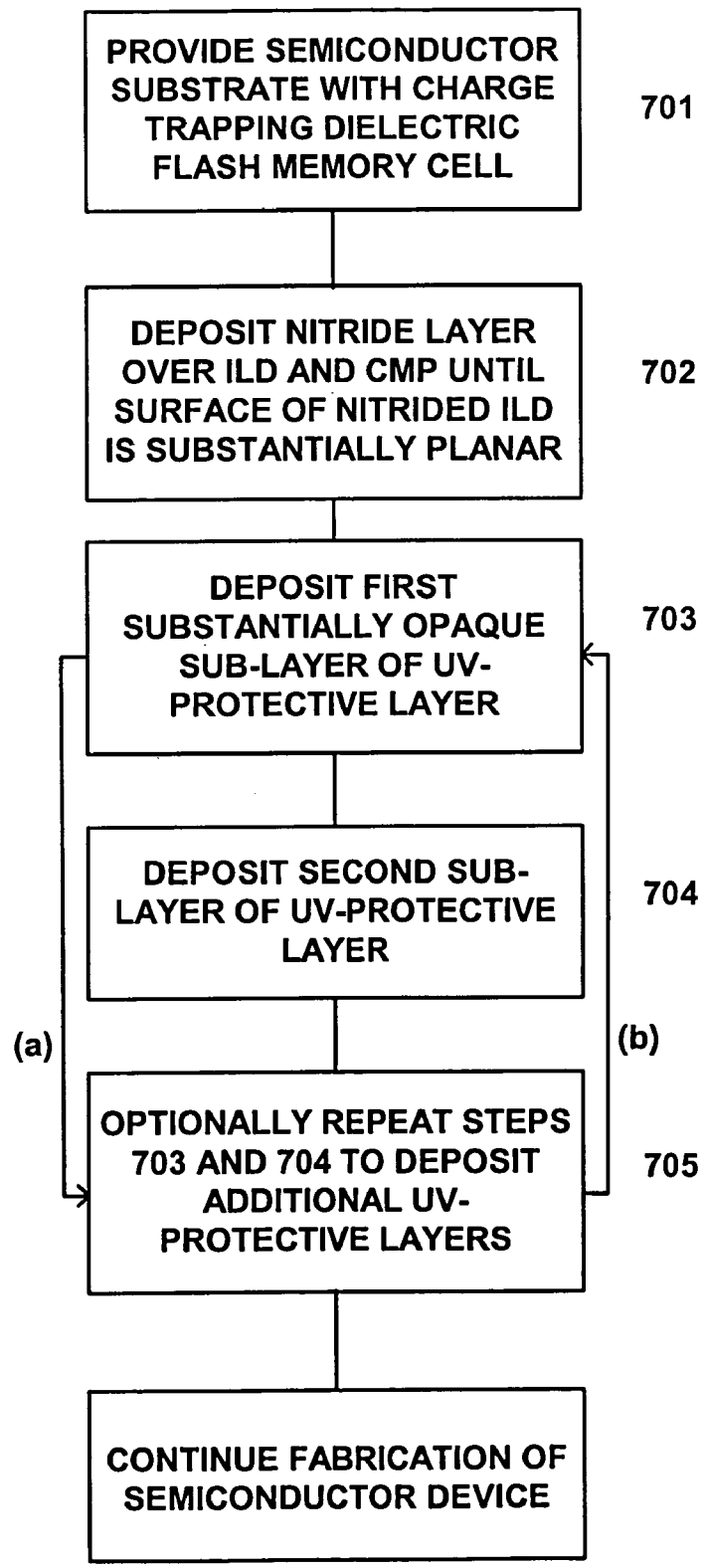
FIG. 7 is a schematic flow diagram showing the steps of an embodiment of the present invention.

The following description of the present invention follows with reference to FIGS. 4–6. FIGS. 4a–4c illustrate, in cross-section, embodiments of the semiconductor device after certain process steps in the fabrication of a substantially planarized ILD layer in accordance with an embodiment of the invention. FIG. 5 illustrates, in cross-section, an embodiment of the semiconductor device after certain process steps in the fabrication of a UV protective layer in accordance with an embodiment of the invention. FIG. 7 is a schematic flow diagram showing the steps of an embodiment of a process in accordance with the present invention.

In the first step of a process in accordance with the present invention, shown schematically in FIG. 7 as step 701, a semiconductor substrate with a charge trapping dielectric flash memory cell fabricated thereon is provided, as shown in FIG. 4a. The charge trapping dielectric flash memory cell may be fabricated by any appropriate method known in the art. Since the fabrication of such semiconductor devices is well known, for the sake of brevity such is not disclosed in detail herein. An example of such a device 10 is shown in FIG. 4a. The component parts of the device 10 shown in FIG. 4a are substantially the same as described above with respect to FIG. 1, and include the source/drain regions 12 and 14 located in the semiconductor substrate 16 and separated by the channel region 18. A stack gate 24 overlies the channel region 18. The device 10 shown in FIG. 4a further includes the first interlevel dielectric layer 20 and the sacrificial layer 37 formed thereon. The sacrificial layer 37 is formed conformal to the topography of the surface of the first interlevel dielectric layer 20, also referred to herein as conformal sacrificial layer 37.

The conformal sacrificial layer 37 may be any material that can be formed on the intermediate structure. Examples of conformal sacrificial layer material include the materials described above. In one embodiment, the conformal sacrificial layer 37 is silicon nitride obtained by a nitridation process. In one embodiment, the conformal sacrificial layer 37 is formed by mounting the substrate 16 in a CVD apparatus. Then, a nitrogen containing gas ($NH_3$) and silane are provided to the CVD apparatus. When a suitable thickness of $Si_xN_y$ has been deposited, the flow of the $NH_3$ gas is stopped. Depositing nitride using conventional RTA techniques may also form the conformal sacrificial layer 37. The pre cursors for a thermal nitride process may be DCS (dichloro silane) or TCS (tetra chloro silane), for example.

The thickness of the conformal sacrificial layer 37 is determined by the thickness variation in the topography of the surface of the first ILD layer 20. Typically, for very large scale integrated circuit fabrication, the thickness of the conformal sacrificial layer 37 is in a range of about 3 nm to about 500 nm. Alternatively, the thickness may be in a range of about 10 nm to about 100 nm. Further still, the thickness may be in a range of about 30 nm to about 50 nm. It should be understood by those having ordinary skill in the art that the above thicknesses are merely exemplary and that the thicknesses may be combined, for example, from about 3 nm to about 50 nm, or about 10 nm to about 30 nm, or about 30 nm to about 100 nm or the like.

The lower limit for the thickness of the conformal sacrificial layer 37 is dictated by the requirements of good step coverage associated with the vertical wall profile of the depressions in the first ILD layer 20 and the viability of the conformal sacrificial layer 37 as a thin layer. The upper limit for the thickness of the conformal sacrificial layer 37 is determined by the CMP species to be used to planarize the surface of the ILD layer 20.

In the second step of the process in accordance with the present invention, shown schematically in FIG. 7 as step 702, the sacrificial layer 37 is polished using, for example, a chemical mechanical polishing (CMP) to remove the sacrificial layer 37 from the thicker surfaces of the ILD layer 20. Thus, portions 37a of the sacrificial layer 37 are left in the depressions of the surface of the ILD layer 20. The portions 37a significantly reduce the thickness variations in the ILD layer 20, as described above. As the sacrificial layer 37 is removed from the thicker surfaces of the ILD layer 20, a monitor can be set to detect when the polishing of the ILD layer 20 begins. For example, the monitor can be set to detect the presence of the material of the ILD layer 20. Thus, the CMP of the ILD layer 20 can be better controlled to produced a more planarized ILD layer.

Next, as shown in FIG. 4c, the contact cap layer 38 is formed over the planarized first interlevel dielectric layer 20. Then, conductive plugs 40 are formed in the device 10 using conventional methods. For example, a photoresist layer is deposited and patterned for the formation of contacts. Next, the apertures 42 are formed in the contact cap layer 38 and the planarized ILD0 layer 20. The apertures 42 are then filled with a conductive material, for example, tungsten, copper or the like.

In the third step of the process in accordance with the present invention, shown schematically in FIG. 7 as step 703, a first layer or sub-layer of the UV-protective layer 46 is deposited over the charge trapping dielectric flash memory cell. In one embodiment, the first layer or sub-layer is substantially UV opaque, as defined above. In one embodiment, the first layer or sub-layer is the contact cap layer 38. In one embodiment, the first layer or sub-layer is the sub-layer 46a. In one embodiment, the contact cap layer 38 is the first layer deposited and this is followed by deposition of the first sub-layer 46a, both of which comprise substantially UV-opaque materials.

In one embodiment, the first sub-layer comprises silicon-rich silicon dioxide. As described above, silicon-rich silicon dioxide has a formula $SiO_x$, in which x<2. (Alternatively, the formula could be expressed as $Si_yO_2$, in which y>1.) As described above, in other embodiments, $1.8 \leq x \leq 1.99$, and another embodiment, $1.88 \leq x \leq 1.95$.

The contact cap layer 38 and/or the first sub-layer 46*a*, comprising a silicon-rich material which absorbs UV radiation, is typically blanket-deposited over the entire wafer. In one embodiment, the method for depositing the first sub-layer is a method which does not use or generate UV radiation. In another embodiment, the method is one which would not expose the charge trapping dielectric memory cell to UV radiation.

In an embodiment in which the contact cap layer 38 and/or the first sub-layer 46*a* comprises silicon-rich silicon dioxide, silicon-rich silicon nitride, or silicon-rich silicon carbide, various methods are commonly known in the art for forming and depositing such materials, and are not discussed in detail herein.

In an embodiment in which the contact cap layer 38 and/or the first sub-layer 46*a* comprises silicon-rich SiCN, and in which the second-sublayer 46*b* comprises non-silicon-rich SiCN, various methods are known for forming and depositing such materials. Due to the variable stoichiometry which can be obtained in SiCN, the formation of silicon-rich, or non-silicon-rich, SiCN is obtained by changing the amount of silicon-containing feed to the process.

In general, in the silicon-rich materials, the higher the refractive index, the higher the UV absorption capability of the material. Increasing the refractive index generally results in an increase in UV opacity of the material.

For example, in an embodiment in which the first sub-layer 46*a* is silicon-rich silicon dioxide, the silicon-rich silicon dioxide may be differentiated from pure or stoichiometric silicon dioxide on the basis of its refractive index. For stoichiometric silicon dioxide, the refractive index is about 1.46 to 1.5. In order to obtain sufficient UV-protection, that is, for the first sub-layer to be substantially UV opaque, the refractive index needs to be greater than 1.5, in one embodiment, the refractive index is greater than about 1.6 and, as noted above, in other embodiments the refractive index may be substantially higher than 1.6. The increase in refractive index of the silicon dioxide is achieved by incorporating more silicon in the silicon dioxide, i.e., by forming silicon-rich silicon dioxide as described above. The determination of whether sufficient silicon is present is easily made by measurement of the refractive index of the layer during processing.

Next, the one or more layers are patterned and etched to form the electrodes 44 and the conductive plugs 40 described above. The etching process is typically multiple etching steps. An etchant species is selected for a particular etch step that is selective between the material to be etched and the material which is to remain relatively unetched.

Similar considerations apply to silicon-rich silicon nitride, silicon-rich SiCN and silicon-rich silicon carbide.

As shown in FIG. 7 as step 704, the third step in the present invention comprises deposition of a second sub-layer 46*b* of the UV-protective layer 46. When a sufficient, selected thickness of the first sub-layer 46*a* has been deposited, the second sub-layer 46*b* is deposited thereover.

As shown in FIG. 7, some embodiments bypass the step 704, proceeding directly to the step 705 and thence optionally returning to step 703 to deposit another layer of substantially UV-opaque material. The bypass of step 704 is schematically illustrated in FIG. 7 by the alternate path (a). Return from step 705 to step 703 is schematically illustrated in FIG. 7 by the alternate path (b).

In one embodiment, as noted above, the material of the second sub-layer comprises a non-silicon-rich form of the material of the first sub-layer. In one such embodiment, the transition from deposition of a silicon-rich to deposition of a non-silicon-rich layer is accomplished simply by changing the deposition conditions. In one embodiment, the transition is accomplished by changing the post-deposition heat treatment conditions, as described above with respect to SiCN.

For example, in one embodiment in which the silicon-rich material is silicon-rich silicon dioxide, the transition from depositing the first sub-layer to depositing the second sub-layer is accomplished simply by changing the quantity of silicon-containing precursor provided to the deposition apparatus from a first quantity which results in deposition of a silicon-rich silicon dioxide, to a second quantity, which results in deposition of a substantially stoichiometric silicon dioxide. In one embodiment, both steps are carried out in the same apparatus, on a substantially continuous basis. In one embodiment, any discontinuity results from any delay or pause in deposition resulting from the change in quantity of silicon-containing precursor being provided to the deposition apparatus. Thus, in one embodiment, the steps 703 and 704 are part of a substantially continuous deposition step, which may be regarded as a combination of steps 703 and 704. This embodiment is illustrated schematically in FIG. 7 by the alternate pathway (b), leading from step 705 back to step 703.

Other methods of depositing the non-silicon-rich material can be suitably selected by those of skill in the art.

An exemplary structure resulting from step 704, deposition of the second sub-layer 46*b*, on the first sub-layer 46*a* shown in FIG. 5 is the structure shown in FIG. 1.

In one embodiment, a second UV-protective ILD layer 48 is deposited over the first UV-protective ILD layer 46, as is shown, for example in FIG. 3. In this embodiment, the steps 703 and 704 are repeated. In one embodiment, one layer, in another embodiment two or more layers, and in yet another embodiment, no layers of another material are formed between the first UV-protective ILD layer and the second UV-protective ILD layer. In one embodiment, the additional layer(s) include metal conductive layers, similar to the layers 44*a*, 44*b* deposited in the openings formed in the respective layer as shown in FIG. 3. Thus, while in one embodiment, a full layer is formed, the layer intervening the first UV-protective ILD layer and the second UV-protective ILD layer may be etched or otherwise partially removed in forming, e.g., a conductive pattern or other "wiring". Then, the second UV-protective ILD layer may be deposited to provide insulation and protection to the intervening layer or material. In one embodiment, the second UV-protective layer replaces a conventional interlayer dielectric layer, such as an ILD2 layer, a contact cap layer or a top oxide layer, as described above.

In another embodiment, shown in FIG. 6, a third UV-protective layer 52 is deposited over the second UV-protective ILD layer 48. FIG. 6 schematically illustrates, in cross-section, a portion of a semiconductor substrate similar to that of FIG. 1, which incorporates a substantially planarized ILD layer 20, a contact cap layer 38, three interlayer dielectric layers 20, 46 and 48 (of which either or both of layers 46 and 48 may be UV-protective layers), and a UV-protective top oxide layer 52, fabricated in accordance with an embodiment of the present invention. The third UV-protective layer, or top oxide layer 52 would be substantially similar to the first and second UV-protective layers, comprising, in one embodiment, a first, substantially UV opaque sub-layer and a second sub-layer, which comprises a non-UV-opaque material, and in another embodiment, comprises a single, substantially UV-opaque layer.

In one embodiment, the third UV-protective layer 52 replaces a conventional interlayer dielectric layer, such as an ILD3 layer.

These embodiments are illustrated in FIG. 7 as step 705, and by the alternate pathway (b), which leads from step 705 back to step 703. According to step 705, step 703 and step 704, or step 703 only, may be repeated as needed to deposit additional UV-protective layers, or substantially UV-opaque layers via alternate pathways (a) and/or (b). As also indicated in FIG. 7, step 705 includes an optional return to step 703, or the process may proceed to the final step shown in FIG. 7, which is to continue fabrication of the semiconductor device.

As indicated in the final step of FIG. 7, following formation of the UV-protective layer or layers in accordance with the present invention, the semiconductor device and the charge trapping dielectric flash memory cell are further processed in BEOL processes, to complete the fabrication of the device, as appropriate. As a result of the present invention, in one embodiment, it is not necessary to protect the device and the charge trapping dielectric flash memory cell from exposure to UV radiation. In other embodiments, it may be desirable to protect the device and the charge trapping dielectric flash memory cell from such exposure, since it may not be possible to fully protect the device from all harmful effects of UV radiation by means of the present invention.

In one embodiment, the semiconductor device and the charge trapping dielectric flash memory cell are protected from exposure to UV radiation during the processing steps subsequent to formation of the stack gate. In another embodiment, the semiconductor device and the charge trapping dielectric flash memory cell are protected from exposure to UV radiation during the processing steps subsequent to formation of the ONO portions of the stack gate. In one embodiment, the semiconductor device and the charge trapping dielectric flash memory cell are protected from exposure to UV radiation during the processing steps subsequent to formation of the charge storage layer. In one embodiment, the protection from UV radiation at and beyond these points in the fabrication process comprises the herein described formation of one or more UV protective layers. In another embodiment, the protection from UV radiation further comprises shielding or otherwise avoiding exposure to UV radiation. In another embodiment, the protection from UV radiation further comprises selection and use of non-UV processes, as described above.

INDUSTRIAL APPLICABILITY

The present invention, the present invention, by providing a UV-protective layer, overcomes the problem of UV-induced charging of charge trapping dielectric flash memory cells, particularly during BEOL processing. The present invention provides advantages such as (1) formation of a UV-protective layer which protects the device from BEOL UV radiation; (2) protection of the charge trapping dielectric flash memory cell from UV-induced charging; (3) provision of a process modification which can be easily accommodated in presently employed fabrication processes; (4) formation of the UV-protective layer with reduced variation in thickness; (5) precision formation of subsequent device features such as contacts; and (6) formation of one or more of a contact cap layer, interlevel dielectric layers, and a top oxide with this additional function in addition to standard dielectric functions. Thus, the present invention provides an advance in ONO fabrication technology, and insures proper charge isolation in ONO structures in charge trapping dielectric flash memory devices, while at the same time providing distinct process and economic advantages. Although described in terms of, and particularly applicable to, charge trapping dielectric flash memory devices, the present invention is broadly applicable to fabrication of any semiconductor device that includes a charge storage layer subject to unwanted UV charging.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A semiconductor device comprising:
   a charge trapping dielectric flash memory cell;
   at least one UV-protective layer,
   the UV-protective layer comprises a substantially UV-opaque material; and
   an interlevel dielectric layer including a portion of a sacrificial layer in a thickness variation of the interlevel dielectric layer,
   the portion of the sacrificial layer reducing the thickness variation in the interlevel dielectric layer.

2. The device of claim 1, wherein the portion of the sacrificial layer comprises one or more of a silicon nitride, a silicon oxynitride, a silicon carbide, a silicon carbide-nitride, a silicon-rich nitride, silicon-rich oxide, silicon-rich carbide, silicon-rich carbide-nitride, carbon polymers, low-k materials, graded films or thin metal films.

3. The device of claim 1, wherein the UV-protective layer is a contact cap layer disposed over the charge trapping dielectric flash memory cell.

4. The device of claim 1, wherein the UV-protective layer protects the charge trapping dielectric flash memory cell from damage resulting from UV exposure during Back End Of Line (BEOL) processing in fabrication of the charge trapping dielectric flash memory device.

5. The device of claim 1, wherein the UV-opaque material comprises one or more of silicon-rich nitride, silicon-rich oxide, silicon-rich carbide, silicon-rich SiCN, carbon polymers, low-k materials, graded films and thin metal films.

6. The device of claim 1, further comprising;
   at least one additional UV-protective layer,
   the at least one additional UV-protective layer comprising at least a sub-layer of a UV-opaque material.

7. The device of claim 6, wherein the at least one additional UV-protective layer is a component of one or more of an interlayer dielectric layer 1, interlayer dielectric layer 2, or a top oxide layer.

8. The device of claim 7, further comprising;
   second and third UV-protective layers,
   wherein the second and third UV-protective layers each comprise at least a sublayer of a UV-opaque material.

9. A semiconductor device comprising:
   a charge trapping dielectric flash memory cell;
   an interlevel dielectric layer including at least one portion of a sacrificial layer in a thickness variation of a planarized interlevel dielectric layer;

a UV-protective contact cap layer disposed over the planarized interlevel dielectric layer,
    the UV-protective contact cap layer comprising a substantially UV-opaque material; and
at least one additional UV-protective layer,
    the at least one additional UV-protective layer comprising at least a sublayer of a UV-opaque material,
wherein each UV-opaque material comprises one or more of silicon-rich nitride, silicon-rich silicon oxide, silicon-rich carbide, silicon-rich SiCN, carbon polymers, low-k materials, graded films and thin metal films, and
wherein the UV-protective layers protect the charge trapping dielectric flash memory cell from damage resulting from UV exposure during BEOL processing in fabrication of the charge trapping dielectric flash memory device.

* * * * *